United States Patent [19]

McAndrews et al.

[11] Patent Number: 5,777,454
[45] Date of Patent: Jul. 7, 1998

[54] BACK-UP BATTERY MANAGEMENT SYSTEM FOR A DC POWER SUPPLY

[75] Inventors: Joseph M. McAndrews, Freeport, N.Y.; Richard H. Jones, Marietta, Ga.

[73] Assignee: Peco II, Inc., Galion, Ohio

[21] Appl. No.: 654,835

[22] Filed: May 29, 1996

[51] Int. Cl.$^6$ .................................. H02J 7/00; H02J 7/04
[52] U.S. Cl. ...................... 320/51; 320/22; 307/64; 307/66
[58] Field of Search ........................ 320/51, 56, 49, 320/50, 53–60, 33, 40, 32, 39, 22, 23; 307/64, 66

[56] References Cited

U.S. PATENT DOCUMENTS

| | | | |
|---|---|---|---|
| 1,343,597 | 6/1920 | Turbayne . | |
| 1,931,867 | 10/1933 | Holden et al. | 171/314 |
| 2,062,274 | 11/1936 | Rees | 171/97 |
| 2,316,331 | 4/1943 | Hedding | 175/363 |
| 2,334,528 | 11/1943 | Amsden | 171/97 |
| 2,398,845 | 4/1946 | Mullerheim | 179/77 |
| 2,653,252 | 9/1953 | Ostendorf, Jr. | 307/64 |
| 2,675,490 | 4/1954 | Portail | 307/48 |
| 3,505,531 | 4/1970 | Wattson | 307/64 |
| 3,585,482 | 6/1971 | Zelina | 320/39 |
| 3,594,628 | 7/1971 | Webster et al. | 320/13 |
| 3,599,071 | 8/1971 | Enghlen et al. | 320/35 |
| 3,710,134 | 1/1973 | Guthart | 307/66 |
| 3,784,892 | 1/1974 | Zelina | 320/59 X |
| 3,854,082 | 12/1974 | Nasby et al. | 320/39 X |
| 3,864,617 | 2/1975 | Smith et al. | 320/32 X |
| 4,096,394 | 6/1978 | Ullmann et al. | 307/46 |
| 4,131,841 | 12/1978 | Bennefeld | 320/32 X |
| 4,220,872 | 9/1980 | Fahey | 307/32 |
| 4,384,214 | 5/1983 | Crick et al. | 307/66 |
| 4,399,396 | 8/1983 | Hase | 320/43 |
| 4,467,265 | 8/1984 | Hierholzer, Jr. | 320/40 X |
| 4,471,233 | 9/1984 | Roberts | 307/66 |
| 4,476,425 | 10/1984 | Chernotsky et al. | 320/39 |
| 4,670,661 | 6/1987 | Ishikawa | 307/66 |
| 4,675,538 | 6/1987 | Epstein | 307/64 |
| 4,686,379 | 8/1987 | Ohnari | 307/66 |
| 4,760,322 | 7/1988 | Crampton | 320/14 |
| 4,761,563 | 8/1988 | Ross et al. | 307/66 X |
| 4,965,462 | 10/1990 | Crawford | 307/66 |
| 5,049,805 | 9/1991 | Celenza et al. | 323/285 |
| 5,093,624 | 3/1992 | Stevenson | 324/426 |
| 5,126,585 | 6/1992 | Boys | 307/66 |
| 5,126,588 | 6/1992 | Reichmeyer et al. | 307/270 |
| 5,160,851 | 11/1992 | McAndrews | 307/66 |
| 5,250,904 | 10/1993 | Salander et al. | 324/430 |
| 5,343,380 | 8/1994 | Champlin | 363/46 |
| 5,376,828 | 12/1994 | Kim et al. | 307/64 |
| 5,422,560 | 6/1995 | Yan | 320/31 |
| 5,469,043 | 11/1995 | Cherng et al. | 320/31 |
| 5,514,915 | 5/1996 | Kim et al. | 307/64 |

*Primary Examiner*—Peter S. Wong
*Assistant Examiner*—K. Shin
*Attorney, Agent, or Firm*—Marshall, O'Toole, Gerstein, Murray & Borun

[57] ABSTRACT

The disclosure generally concerns a battery management system for a back-up battery for an uninterruptible primary DC source for telephone switching equipment or other loads. The battery management system includes variable isolation impedance means having high reverse impedance and variable forward impedance connected in series with the battery for effectively electrically isolating the battery from the system load bus without loss of battery back-up capability. Control means responsive to one or more predetermined system load bus and battery conditions and parameters adjusts the forward impedance of the impedance means between a relatively higher impedance level or levels effective to isolate said battery from the system load bus and a relatively lower forward impedance level or levels effective to connect the battery to the system load bus. During recharge of the battery after an emergency discharge into the load, the control means maintains the forward impedance of the variable impedance means at a normally lower level until the charging current falls to a predetermined charging current level, and then adjusts the forward impedance of the variable impedance means to a relatively higher level to isolate the battery from the primary DC supply voltage.

29 Claims, 1 Drawing Sheet

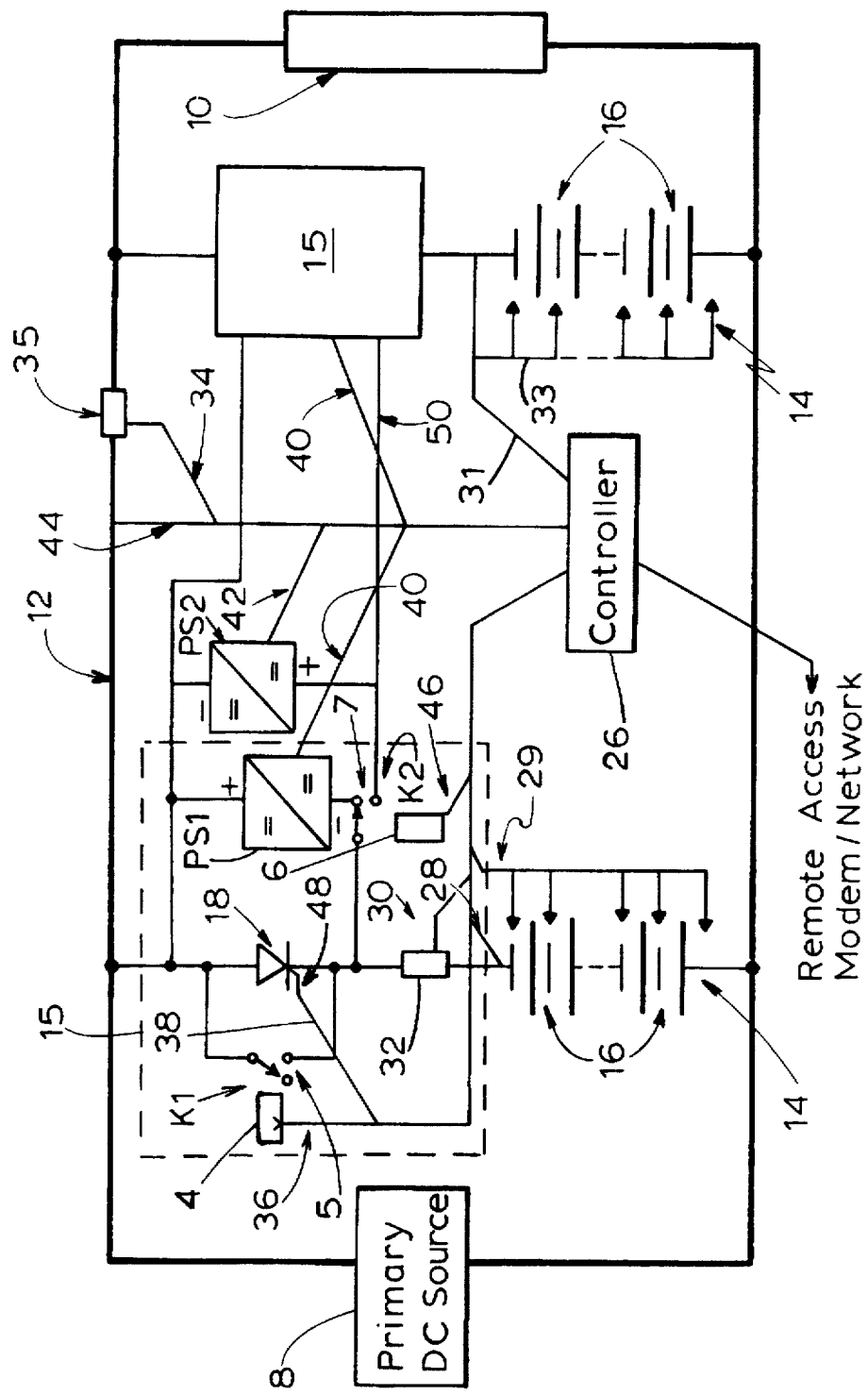

BACK-UP BATTERY MANAGEMENT SYSTEM FOR A DC POWER SUPPLY

BACKGROUND OF THE INVENTION

The present invention relates to a back-up battery management system for use with a primary DC power supply for telephone switching equipment or other loads.

In telephone switching equipment, communication and computer equipment, and in many other applications, the need for an uninterrupted source of DC power is critical. Rectified commercial AC power is typically used as the primary source of DC power for such equipment.

To avoid any interruption or outage in power service, it is common practice to employ a battery back-up for the primary DC source. Back-up battery systems typically include strings of batteries or cells connected in parallel with the primary DC source and the load. In the event of a drop in the load bus voltage below a predetermined threshold, the back-up battery supplants or supplements the primary source of DC power. Back-up battery systems are designed to replace the primary DC power source for a predetermined period of time within which resumption of primary power is expected to occur.

In conventional back-up battery systems, the nominal system load bus voltage has typically been dictated by battery characteristics. For example, in a telephone switching plant, back-up batteries are commonly employed which have a design cell voltage of −2.26 volts, for optimum health of the battery cell. Twenty-four cells are typically combined in a string, resulting in a nominal load bus voltage of approximately −54 volts. A bank of strings supplies the necessary back-up DC power.

As the back-up batteries are placed across the load, the full 54 volts of system DC voltage are placed across the battery string. This design architecture of a typical back-up battery system presents a number of potential problems. Certain batteries, due to their electrochemical constitution, will draw more current than other batteries. All batteries, as they age, will experience increasing internal resistance and will draw more charging current from the main DC supply.

About a decade ago, a new type of lead acid battery was introduced into the marketplace. The battery is sealed, and allegedly requires no maintenance. In this type of battery, oxygen and hydrogen produced during electrochemical reactions in the battery recombine to maintain an aqueous liquid electrolyte at a constant level within the cell. As a result, these batteries have only a small amount of liquid electrolyte. These batteries have become known as "valve regulated", or "recombinant" or "electrolyte-starved" batteries.

This type of lead acid battery (hereinafter termed "valve regulated lead acid" or "VRLA" batteries) has often failed well before their design life, which is typically 10 years.

A particular battery may, for various reasons not clearly understood, begin to take on more amperage to maintain its charge. The increasing charging current will elevate the temperature of the battery. The chemical recombination of the oxygen and hydrogen gases also creates heat. As the internal battery temperature increases, the current demand increases disproportionately. For every 10 degrees centigrade of increase in the battery's internal temperature, the current demand doubles. A battery in this condition will have one of two failure modes, the most damaging being "thermal runaway". Thermal runaway may lead to an explosion of the battery, with likely destruction or severe damage to any nearby equipment. Alternatively, the battery may experience a "melt down" and produce noxious gases which are also apt to damage or destroy neighboring equipment.

The rectified AC source provided in typical telephone switching plants has more than ample capacity to supply any one or more batteries demanding abnormal charging current, thus encouraging the aforedescribed thermal runaway or meltdown failures.

With the advent of fiber optic signal distribution, switching equipment has been decentralized, introducing a need for DC power supplies in unattended satellite installations distributed throughout the territory served.

In these unattended installations, the equipment is often closely packed, leading to hostile thermal operating conditions for the equipment and increased occurrences of thermally induced failures.

In less severe conditions, the placement of the back-up batteries directly across the load is apt to result in dry-out (loss of electrolyte), positive grid corrosion, and other problems which may lead to premature battery failure and/or sub-normal power performance.

Back-up battery systems must be monitored to determine the health and capacity of the batteries. The need to perform battery tests is particularly troublesome in systems which require the supply of an uninterrupted source of DC power. Testing of the vital statistics of a battery affecting output capacity, predicted life, etc. is presently done by taking the battery strings off-line and testing them in one of two ways. The test procedure recommended by battery manufacturers as being the most reliable is to discharge the battery into a load while measuring the response of the battery. The ability of a battery or battery string to hold a predetermined current level for a predetermined time is a reliable measure of the health and capacity of the battery. However, such discharge tests in the field require experienced personnel and are difficult and costly. Further, conventional battery testing, requiring the batteries to be taken off-line, suffers a loss of standby battery protection for the telephone plant or other equipment being supplied while the tested batteries are off-line.

To avoid the cost and inconvenience of a discharge test, it is commonplace to employ special field test equipment which tests for battery resistance, impedance, inductance, and other parameters and characteristics without discharging the battery. See U.S. Pat. No. 5,250,904. However, as noted, tests which do not involve discharging the battery are apt to be less reliable.

SUMMARY OF THE INVENTION

U.S. Pat. No. 5,160,851 to Joseph M. McAndrews, one of the present inventors, discloses a back-up battery system for telephone central office switching equipment. The back-up battery system includes one or more rechargeable batteries having cells floated at a given float voltage. The cells are of a number such that when the batteries are switched in circuit across the load, the cumulative voltage of the batteries exceeds a predetermined load voltage for a preselected period. The over-voltage that results from the switching in of extra cells across the load is down converted by a converter. The converter, a sensor for sensing the system discharge bus voltage, and a switch may be formed as a single unit using MOSFET technology. It is said that in such case a fail-safe contact switch might also be provided to parallel the MOSFET switch and be operated in the event of its failure.

The present invention concerns a back-up battery management system for use in a DC power supply system for use with telephone switching equipment or loads of other types. The battery management system is particularly adapted for use with batteries of the valve regulated lead acid type, but also finds utility with older "flooded" lead acid type batteries and batteries of other types.

In accordance with the present invention, there is provided a back-up battery management system for an uninterruptible primary DC power supply which permits the back-up batteries to be maintained on-line at all times, even during discharge testing of the batteries.

In accordance with one aspect of the present invention, the back-up battery management system includes means for charging the batteries with a predetermined level of substantially constant current while isolating the batteries from the system load bus, thus avoiding the possibility of thermal runaway or other deleterious effects which may result from placing the batteries directly on the system load bus. The charging current is substantially constant at a given time and for a given condition of the battery cells/monoblocks, but may differ at different times and battery conditions.

A control system is provided which monitors and controls all significant conditions and parameters within the back-up battery management system to maintain the battery system at a float charge during normal operation, and to test battery health and capacity by the favored battery discharge method, without loss of standby DC power protection for the serviced equipment.

BRIEF DESCRIPTION OF THE FIGURE

The FIGURE is a schematic block diagram containing the basic components of the battery management system of the present invention and the environment in which it is suitably used.

DESCRIPTION OF THE PREFERRED EMBODIMENT

In the FIGURE, a primary DC source 8 supplies DC power to a system load 10 through a system load bus 12. The primary DC source 8 may comprise a conventional system for developing rectified DC power from a commercial source of AC power.

A system for use in a telephone switching office may employ a bank of battery strings. In the illustrated embodiment, two exemplary strings of batteries are shown schematically at 14. In a typical installation, each battery string comprises a number of cells or groups of cells (termed "monoblocks") 16 herein sometimes referred to as "cells/monoblocks". As noted, each cell may produce, for example, −2.26 volts. In a bank of 24 cells, a total of approximately −54 volts DC is developed.

Basic components of the battery management system according to the present invention are contained with a battery string module 15. An important component of the battery string module 15 is a variable isolation impedance connected in series with the battery strings 14. (As used herein, the terms "battery" and "battery string" are used interchangeably to mean any series of battery cells, irrespective of their particular construction.)

The function of the isolation impedance, here shown as a thyristor or SCR 18, is to electrically isolate the battery strings 14 from the system load bus 12. As will become evident from the ensuing description, having isolated the battery strings 14 from the system load bus 12, a variety of benefits can be realized that are not available to prior art back-up battery management or monitor systems in which the battery strings are placed directly across the load. As explained above, placement of the battery strings across the load and subject to the primary DC source sets up conditions for thermal runaway, accelerated positive grid corrosion and electrolyte dry-out in VRLA batteries, for example, and establishes conditions for performance and reliability degradation in batteries of other types.

As will be explained in the following text, the present invention makes possible controlled charging of the battery strings at a rate which is constant at a given time and for a given condition of the battery cells/monoblocks to avoid the potential for thermal runaway and the other performance and reliability degrading problems which plague prior systems. Further, these benefits are achieved without depriving the battery strings of their capability of supplying emergency DC power to the load in the event of an outage or drop in the primary DC source output voltage.

Any of a number of circuit structures and components may be employed to implement the variable isolation impedance means which have a high reverse impedance and a variable forward impedance. In the preferred embodiment illustrated a shunted gated silicon device is employed—as noted, here shown as an SCR (silicon controlled rectifier) 18.

A shunting contactor set K1, comprising a normally closed relay 4 actuating a set of switch contacts 5, is connected in parallel with the SCR 18 and connects the battery strings 14 to the system load bus 12 under certain conditions, as will be explained. The shunting contactor set K1 has break-type (normally closed) contacts, thus connecting the battery strings 14 to the system load bus 12 in the event that the contactor set K1 or its control fails.

In accordance with an important aspect of the present invention, a float/boost power converter PS1 is connectable in series with the battery strings 14 to provide a constant maintenance or "float" current to float charge the battery strings 14. The converter may be of conventional construction, with the addition of circuitry to make possible the application of a constant voltage across the battery cells/monoblocks and control of battery current, as will be described hereinafter. The level of float current is dependent upon the type, size, and age of the battery. As will be explained, under normal operating conditions the SCR 18 is supplied a constant gate current (herein termed a "bard" drive) sufficient to maintain the SCR 18 in a ready-to-conduct mode. The battery strings 14 are thus connected to the system load bus 12 for all conditions when the primary DC source 8 is unable to supply the system load current. It is noted that float charging at a constant current prevents thermally damaging of any of the battery cells through thermal runaway or meltdown, as explained above.

In accordance with another feature of the present invention, a second power converter PS2, of conventional construction, is connectable in series with the battery strings 14 in a reverse polarity condition to discharge the battery strings 14 into the load 10 for the purpose of testing the performance and condition of the battery strings, as will be explained in detail hereinafter.

A battery management controller 26 performs monitoring and controlling functions in the battery management system of the present invention. The controller 26 monitors the voltage of each battery string (see leads 28 and 31 in the FIGURE), the battery cell/monoblock voltage or battery-string midpoint voltage (leads 29 and 33), the battery-string current (lead 30 and current monitor shunt 32), system load current (lead 34 and load current shunt 35), and battery internal temperature and resistance (leads 29 and 33), as well as the system load bus voltage (lead 44).

The controller controls the discharge contactor set K1 (lead 36), the SCR 18 (lead 38), the float/boost power converter PS1, (lead 40), and the discharge test power converter PS2 (lead 42).

The operation of the system according to the present invention will now be described.

The battery management system of the present invention provides a means to control the factors which influence the life of a VRLA battery or batteries of other types. The control and management of the way a VRLA battery is charged, with particular attention to the float, boost and temperature compensation methods of charging VRLA batteries, will help maximize their useful life. Further, the present battery management system provides means to test a string or strings of VRLA batteries while monitoring cell voltages, thus obtaining accurate information with regard to both their health and state of readiness (capacity). Also, the battery management system is designed so that any failure mode affecting the ability of the system load bus 12 to sustain the system load 10 will immediately return the power system to a standard rectifier/battery/load configuration.

During normal operation the primary DC source 8 supplies all load current via the system load bus 12 to the system load 10. The VRLA battery strings 14 are connected to the system load bus 12, but displaced/blocked by the forward voltage drop of the SCR 18. The SCR 18 provides an approximate 1.5 volt differential, thus effectively removing the battery strings 14 from the influence of the primary DC source 8.

During float charge operation, the predominate mode of operation for communications batteries, the power converter PS1 provides a predetermined substantially constant maintenance or float current to float charge the battery strings 14. The amount of the current is dependent upon the type, size, and age of the VRLA battery. Also, as noted, the float charging current is substantially constant at a given time and for a given condition of the battery cells/monoblocks, but may differ at different times and battery conditions. SCR 18 is provided a constant gate signal to maintain the SCR 18 in a ready-to-conduct mode and connect the battery strings 14 to the system load bus 12 for all conditions when the primary DC source 8 is unable to supply the system load current.

While maintaining the battery strings 14 on float charge, on a command signal from the battery management systems controller 26, PS1 increases its constant current output to a higher boost amount. Like the float charging current, the boost charging current is constant at a given time and for a given condition of the battery cells/monoblocks, but may differ at different times and battery conditions, and will differ depending upon size of the VRLA battery. In practice, the substantially constant charging current, float and boost, delivered to the battery strings is determined by testing, at the direction and under the control of the controller 26, the battery cells/monoblocks individually. The controller determines for a given application of charging current, or a given period of time, an optimum level of current which will cause the battery cells/monoblocks to deliver optimum performance over a maximum predicted life. The testing of the battery cells/monoblocks may include impressing on the individual cells/monoblocks a fixed voltage equal to the primary source voltage developed within the converter PS1 to determine the current demand of the individual cells/monoblocks. The converter PS1 has a current limiter to limit the current supplied to the individual cells/monoblocks during the test.

The increased current begins to boost charge the battery strings 14. If the battery string voltage approaches the level at which the SCR 18 conducts, a voltage detector circuit which monitors the battery string voltage removes the gate signal supplied to the SCR gate 48. The voltage detector circuit for convenience may be considered to be part of the controller shown schematically at 26.

The frequency of occurrence of the command signal from the controller 26 that initiates the boost charge is determined by battery measurements taken periodically (every 24 hours, for example) while on float charge. The end of the boost charge occurs when the voltage of the battery strings 14, monitored by the controller 26, reaches a peak and levels off. During this period, VRLA battery cell or monoblock voltages (or battery string midpoints as a minimum) are monitored by the battery management system controller 26 to insure that the cells 16 are properly accepting, the higher charge current.

The boost charge, which occurs when needed (as determined by battery parameter measurements), insures that both the positive and negative electrodes of the battery string cells 16 are polarized. Boost charging insures that the cells 16 are fully charged and can recombine the gases involved. This will minimize cell "dry out" (water loss), and add to the useful life of the VRLA battery cells.

Whenever the primary DC source 8 is unable to supply the total load current, the system load bus voltage begins to decay. The SCR 18 is receiving a hard gate signal at this time and immediately begins to conduct, placing the batteries onto the system load bus 12. A voltage detector located in each battery string module 15 constantly monitors the system load bus voltage, senses a decay in that voltage and commands contactor set K1 to release, thus connecting the battery strings 14 directly to the system load bus 12. The voltage detector circuit for convenience may be considered to be part of the controller 26. The SCR 18, now shorted by contactor set K1, ceases to conduct but remains available. The closure of the contacts of the contactor set K1 takes place less than 1 second after the initiation of the decay of the system load bus voltage. The transition of battery power to the system load bus 12 is smooth and without interruption.

Throughout all battery discharges, including emergency discharges and test discharges (to be described), the battery management system controller 26 is constantly monitoring the battery string voltage(s) to determine the remaining reserve capacity. Individual cell voltages or monoblock voltages (or battery string midpoint voltages as a minimum) are also monitored and the data is stored for later use in determining the health and reserve capacity of the battery strings 14.

After the primary DC source 8 returns to operation, it again supplies all load current via the system load bus 12 to the system load 10.

Contactor set K1 remains released (closed), allowing the primary DC source constant voltage output to charge the battery strings 14. Contactor set K1 does not operate (open) until the battery string charge current, as detected by the controller 26, falls below a predetermined boost charge level. At that time the gate signal to the SCR 18 is removed, contactor set K1 operates (opens), and the battery strings 14 receive the remaining boost charge from converter PS1. Once properly charged the battery strings 14 return to the float charge mode.

During float charge operation and stable conditions, individual battery string discharge tests can be programmed to start. Such tests are typically needed only 2 or 3 times per year and the controller 26 can be programmed to perform the tests automatically. These tests can also be performed manually with local input, or manually with remote input. During any mode of testing, the controller 26 provides a signal when the test is to begin.

When the controller 26 determines that it is time for a particular battery string 14 to be subjected to a battery discharge test (each battery string individually), it commands the contactor set K2 to operate. Contactor set K2 preferably comprises a relay 6 actuating a set of switch contacts 7.

This operation transfers the battery string 14 from the float/boost power converter PS1 output to the test discharge bus 50. The controller 26 signals the test discharge power converter PS2, located between the test discharge bus 50 and the system load bus 12, to increase its output voltage until the combined voltage of the battery string 14 and converter PS2 slightly exceeds the system load bus voltage. At this time the battery string 14 begins to provide load current. The test power converter PS2 regulates the combined output voltage to maintain a battery test discharge current equal to the battery's rated 8 hour discharge rate (which depends upon size of the battery). Throughout this test the system load bus voltage will not increase by more than a few tenths of a volt.

During the battery discharge test, the battery string voltage is monitored to determine the remaining reserve capacity of the batteries. A discharge of short duration is sufficient to determine reserve capacity. The test duration is dependent upon the size of the VRLA battery and its reserve time design objective. When the controller 26 battery program determines that the controller has sufficient and consistent information to predict string capacity, the test is terminated. In applications with two or more battery strings, each string is tested separately, and then only after the previously tested string has completed its recharge and has been returned to its float charge mode.

Many remote applications have battery strings comprised of multiple "monoblock" batteries (typically a 6 or 12 volt group of cells). Each replaceable "monoblock" is monitored during all modes to allow the identification of weaker "monoblocks" within a battery string.

A "hard" gate drive signal is supplied to the gate 48 of the SCR 18 at all times except when a voltage detector circuit (comprising part of the controller 26) senses that the battery string voltage is greater than a predetermined voltage threshold—herein termed "Threshold #1." At this time the voltage detector circuit will disable the gate drive signal to prevent the SCR 18 from conducting. This condition usually occurs during the boost charge mode of operation. A second voltage detector circuit (also part of the controller 26) monitors the system load bus 12 and restores the gate drive signal for the SCR 18 if the bus voltage falls below a second predetermined voltage threshold, herein termed "Threshold #2."

The shunting contactor set K1 is in parallel with the SCR 18 and connects the battery strings 14 to the system load bus 12 whenever the system load bus voltage falls below Threshold #2. The contactor set K1 has break-type (normally closed) contacts, thus connecting the battery strings 14 to the system load bus 12 if the contactor set K1 or its control fail. The contactor set K1 is operated (open) during float, boost, or test discharge modes.

Following a battery discharge, due to the load bus voltage being less than Threshold #2 (assuming the primary DC source is still inoperable or not keeping the load bus voltage at the desired magnitude), the contactor remains un-operated (closed), keeping the battery strings 14 attached to the system load bus 12. Once the recharge current to the battery strings has dropped below the boost charge current ($>I_{Boost}$) setpoint, the contactor set K1 will be operated (opened) and return the SCR 18 to its blocking function. The boost charge circuit will now finish recharging the battery strings 14.

The actions of the controller 26 identified above will now be described in more detail. Individually, for each item monitored, the control action of the controller will be described.

System load bus voltage

The controller 26 monitors the system load bus voltage continuously and uses the data derived during emergency discharges to calculate remaining capacity during an emergency discharge.

Battery string voltage (all strings)

The controller 26 monitors the battery string voltage during the test discharge and uses the data derived to calculate the battery strings' predicted capacity. It also uses this information to help determine the battery string health.

Battery cell monoblock voltages or battery string midpoints

The controller 26 monitors these data continuously and uses the information to help determine battery cell/monoblock health.

Battery string current (each string)

The controller monitors this information during battery recharge to determine when the contactor set K1 (relay) should be energized (opened). The power converter PS1 is then used to finish charging the battery string.

System load current

The system load current is monitored continuously by the controller 26. These data are used during an emergency discharge to calculate the systems's remaining capacity.

Temperature (near batteries)

The ambient temperature in the near vicinity of the batteries is measured continuously and the information used to help calculate what temperature compensation might be needed to adjust a battery string or strings float current charge (i.e., to increase or decrease the float current).

Contactor set K1

The K1 contactor is a normally closed contactor. During the float/boost mode and the test discharge mode, contactor set K1 is energized (open), thus removing its direct connection across the SCR 18. When de-energized (closed), it shunts the SCR 18. The controller 26 can program contactor set K1 either ON (open) or OFF (closed).

SCR 18

The function of the SCR (18 is to provide a voltage block of the system load bus voltage from the battery strings 14. However, it still provides a passive connection for the battery strings 14 to the system load bus 12. Responsive to the controller 26, this is accomplished by the SCR's control gate 48 being supplied a constant hard drive signal current.

Contactor set K2

The contactor set K2 is a normally closed contactor. In this state it connects the power converter PS1 to the negative output of the battery strings 14. When the controller 26 determines that there is a need for a battery string discharge test, the controller energizes contactor set K2. This connects the negative output of the battery strings 14 to the test discharge bus 50. The contactor set K2 is maintained in an energized state until either the discharge test is completed or the system load bus voltage falls below the Threshold #2 setting. In that event, both contactor set K1 and contactor set K2 are de-energized (closed).

Float/boost power converter PS1

Converter PS1 supplies both the float and boost substantially constant current charges to the battery strings 14. The mode of operation, float charge (a lower value of substantially constant current) or boost charge (a higher value), and the particular level of current selected, is always determined by the controller 26.

Discharge test power converter PS2

After the controller 26 has initiated a battery string discharge test by energizing contactor set K2, it sends a signal to turn on converter PS2. It also signals converter PS2 as to what discharge current level it is to maintain. The converter PS2 then proceeds to add its voltage to that of the open circuit voltage of the battery strings 14 connected to the test discharge bus 50 and automatically maintains the voltage level needed to discharge into the system load bus 12 the programmed current level. When the test is ended the converter PS2 is turned off.

A demonstration system embodying the invention, constructed for use in a telephone switching plant, has the following specifications.

| | |
|---|---|
| Nominal primary DC source | −54 VDC |
| Nominal battery string voltage (float) | −54 VDC |
| Battery string voltage (open circuit) | −48 to −49 VDC |
| Number of battery strings | 4 |
| Battery string charging current (constant float) | 10–120 mA |
| Battery string charging current (constant boost) | 100–1200 mA |
| Test discharge current | 0–10 Amp |
| Voltage threshold #1 | −55 VDC |
| Voltage threshold #2 | −53 VDC |
| Rating of SCR 18 | 50 Amp |
| Normal SCR gate drive current | 1–10 mA |

The above-described embodiment is merely illustrative of the many possible specific embodiments which represent applications of the present invention. Numerous and varied other arrangements can readily be devised following the principles of the invention without departing from the spirit and scope of the invention. For example, whereas the controller 26 has been described as being remote from the power management system, to protect the power supply system from a failure in the controller a number of the monitoring and control functions, e.g., control of the contactor set K1, the power converter PS1, and the SCR 18 to name just three control functions, may be incorporated in a local controller (preferably located in the battery string module 15) forming part of the battery management system.

Whereas the invention has been described in a VRLA battery application, the principles of the invention may be employed with flooded lead acid batteries, and rechargeable batteries of other types.

What is claimed is:

1. A battery management system for a battery connected to a load bus wherein the load bus is further connected to a primary DC source, comprising:
   variable isolation impedance means having high reverse impedance and variable forward impedance connected in circuit with said battery for electrically isolating said battery from said system load bus without loss of battery back-up capability;
   control means coupled to the variable isolation impedance means for controlling the forward impedance of the variable isolation impedance means in dependence upon a sensed condition; and,
   a shunt and connecting means responsive to said control means for selectively connecting said shunt across said variable impedance means to selectively connect said battery to said load bus.

2. The system defined by claim 1 wherein said variable impedance means comprises a gated silicon controlled device controlled by said control means.

3. The system defined by claim 2 wherein during recharge of said battery after an emergency discharge into said load, said control means maintains said shunt across said variable impedance means until the charging current falls to a predetermined charging current level, and then adjusts the connecting means to disconnect the shunt to again electrically isolate said battery from said primary DC supply voltage.

4. For use with a primary DC source which supplies a primary DC supply voltage to a system load bus, said primary DC source having a parallel back-up battery, a battery management system for the back-up battery comprising:
   control means for sensing battery and system conditions and for supplying control signals to components of the battery management system;
   an isolation impedance circuit connected in circuit with said battery and responsive to said control means for selectively electrically isolating said battery from said system load bus without loss of battery back-up capability, said isolation impedance circuit comprising an SCR connected in parallel with a controlled switch, said controlled switch having a first state wherein said controlled switch shunts said SCR to connect said battery to said system load bus; and
   battery charging means for supplying a charging current to said battery while said battery is isolated from said system load bus by said isolation impedance circuit.

5. The system defined by claim 4 wherein the charging current is substantially constant at a given time and for a given condition of the battery.

6. The system defined by claim 5 wherein said battery charging means responds to commands from said control means to develop a substantially constant float current and a substantially constant boost current, said float current being lower than said boost current.

7. The system defined by claim 5 wherein said SCR is controlled by said control means.

8. The system defined by claim 6 wherein said SCR has variable forward impedance and wherein said control means adjusts the forward impedance of said SCR to a first level when said battery charging means is supplying said float current, and to a second level when said battery charging means is supplying said boost current, said second level being higher than said first level.

9. The system defined by claim 5 wherein said battery is a valve-regulated lead acid battery.

10. For use with a primary DC source which supplies a primary DC supply voltage to a system load bus for use by a load, and which primary DC source has a parallel back-up battery having a battery output voltage, a battery management system for the back-up battery comprising:
    control means for sensing battery and system conditions and for supplying control signals to components of the battery management system;
    isolation impedance means connected in series with said battery and responsive to said control means for selectively electrically isolating said battery from said system load bus without loss of battery back-up capability; and
    test discharge means adapted to be connected in series with said battery and said system load bus in response to control signals from said control means for developing a predetermined test voltage, the sum of said predetermined test voltage and the battery output voltage being effective to discharge a test current into the load, whereby said battery may be discharge tested while in a ready state in said system.

11. The system defined by claim 10 wherein said isolation impedance means includes a gated silicon controlled device controlled by said control means.

12. The system defined by claim 11 wherein said battery is a valve-regulated lead acid battery.

13. For use with a primary DC source which supplies a primary DC supply voltage to a load, a method of recharging a parallel battery in a back-up battery system after a drop in the primary supply voltage has caused the battery to be discharged into the load and after the primary supply voltage has been restored across the load and battery, the method comprising the steps of:

monitoring the flow of battery charging current being delivered into the battery from the primary supply voltage restored across the battery;

responsive to the flow of battery charging current, causing the primary supply voltage to be applied across the battery until the level of battery current charging falls to a predetermined first charging current level;

responsive to attaining said predetermined first battery charging current level, electrically isolating the battery from the primary supply voltage without loss of battery back-up capability;

delivering into the battery a current at a predetermined second current level lower than said first battery charging current level until the voltage across the battery rises to a predetermined first battery voltage level; and responsive to the attainment of said predetermined first battery voltage level, delivering into the battery a current at a predetermined third current level lower than said second current level.

14. The method defined by claim 13 wherein the charging current is substantially constant at a given time and for a given condition of the battery.

15. The method defined by claim 14 wherein said isolating of the battery from the primary supply voltage is achieved by providing a high impedance in series with said battery.

16. The method defined by claim 15 wherein said high impedance is a gated silicon device, and wherein a gate input to the gated silicon device is responsive to the primary supply voltage applied across the load.

17. The system defined by claim 16 wherein said battery is a valve-regulated lead acid battery.

18. A battery management system for a battery connected to a load bus wherein the load bus is further connected to a primary DC source, comprising:

a variable isolation impedance circuit connected in circuit with said battery for selectively electrically isolating said battery from said system load bus without loss of battery back-up capability, said isolation impedance circuit comprising an SCR connected in parallel with a controlled switch, said SCR having a high reverse impedance and a variable forward impedance, said controlled switch having a first state wherein said controlled switch shunts said SCR to connect said battery to said system load bus; and control means coupled to the variable isolation impedance for controlling the forward impedance of the SCR and the state of the controlled switch in dependence upon a sensed battery condition or parameter.

19. The system defined by claim 3 wherein when the charging current falls to the predetermined charging current level, the control means adjusts said variable forward impedance to a higher level.

20. A charging and monitoring apparatus for use with a battery employed as a back-up power supply to a primary source of power, the primary power source including a load bus for delivering power, the apparatus comprising:

a battery module in circuit with the battery for selectively supplying charging current thereto, the battery module being in circuit with the load bus and including an isolating impedance circuit having a variable impedance for selectively isolating the battery from the load bus of the primary power source;

a discharge module for testing the health of the battery by selectively discharging the battery to the load bus; and, a controller in circuit with the battery module and the discharge module for controlling the operation thereof.

21. An apparatus as defined in claim 20 wherein the battery module includes a power converter for selectively supplying the charging current to the battery, the power converter being responsive to the controller to adjust the level of the charging current supplied to the battery.

22. An apparatus as defined in claim 20 wherein the isolation impedance circuit comprises an SCR and a controlled switch, the controlled switch being connected in parallel with the SCR to selectively form a shunt across the SCR, the shunt connecting the battery to the load bus.

23. An apparatus as defined in claim 22 wherein the SCR has a high reverse impedance, a first forward impedance, and a second forward impedance, the second forward impedance being higher than the first forward impedance.

24. An apparatus as defined in claim 23 wherein the controller causes the controlled switch to form the shunt across the SCR in the event of a failure of the primary power source.

25. An apparatus as defined in claim 24 wherein the controller switches the SCR to the second forward impedance in the event of a failure of the primary power source.

26. An apparatus as defined in claim 22 wherein during recharge after the battery has been at least partially discharged, the controller causes the controlled switch to maintain the shunt across the SCR until the charging current falls to a predetermined charging level, and then causes the controlled switch to change states to again electrically isolate the battery from the load bus.

27. An apparatus as defined in claim 20 wherein the controlled switch shunts the SCR and connects the battery to the load bus when a voltage of the load bus drops below a predetermined level.

28. An apparatus as defined in claim 20 wherein the discharge module comprises a power converter for developing a discharge voltage which, when summed with a voltage developed by the battery, discharges the battery into the load.

29. An apparatus as defined in claim 20 further comprising a controlled switch for selectively disconnecting the discharge module from the battery.

* * * * *